(12) United States Patent
Loiseau et al.

(10) Patent No.: US 10,793,430 B2
(45) Date of Patent: Oct. 6, 2020

(54) METHOD FOR PRODUCING THIN MEMS WAFERS

(71) Applicant: Robert Bosch GmbH, Stuttgart (DE)

(72) Inventors: Sebastien Loiseau, Stuttgart (DE); Arnim Hoechst, Reutlingen (DE); Bernhard Gehl, Wannweil (DE); Eugene Moliere Tanguep Njiokep, Reutlingen (DE); Sandra Altmannshofer, Augsburg (DE)

(73) Assignee: Robert Bosch GmbH, Stuttgart (DE)

( * ) Notice: Subject to any disclaimer, the term of this patent is extended or adjusted under 35 U.S.C. 154(b) by 35 days.

(21) Appl. No.: 16/131,455

(22) Filed: Sep. 14, 2018

(65) Prior Publication Data

US 2019/0092631 A1   Mar. 28, 2019

(30) Foreign Application Priority Data

Sep. 25, 2017   (DE) .......................... 10 2017 216 904

(51) Int. Cl.
*B81C 1/00* (2006.01)

(52) U.S. Cl.
CPC ...... *B81C 1/00476* (2013.01); *B81C 1/00158* (2013.01); *B81C 2201/014* (2013.01); *B81C 2201/0132* (2013.01); *B81C 2201/056* (2013.01)

(58) Field of Classification Search
None
See application file for complete search history.

(56) References Cited

U.S. PATENT DOCUMENTS

2010/0029031 A1* 2/2010 Perruchot .......... B81C 1/00507
                                                        438/50
2016/0238390 A1* 8/2016 Yu ..................... G01C 19/574

* cited by examiner

*Primary Examiner* — Alexander G Ghyka
(74) *Attorney, Agent, or Firm* — Norton Rose Fulbright US LLP; Gerard Messina

(57) ABSTRACT

A method for producing thin MEMS wafers including: (A) providing an SOI wafer having an upper silicon layer, a first SiO2 layer and a lower silicon layer, the first SiO2 layer being situated between the upper silicon layer and the lower silicon layer, (B) producing a second SiO2 layer on the upper silicon layer, (C) producing a MEMS structure on the second SiO2 layer, (D) introducing clearances into the lower silicon layer down to the first SiO2 layer, (E) etching the first SiO2 layer and thus removing the lower silicon layer.

7 Claims, 8 Drawing Sheets

METHOD FOR PRODUCING THIN MEMS WAFERS

CROSS REFERENCE

Figure 1A:
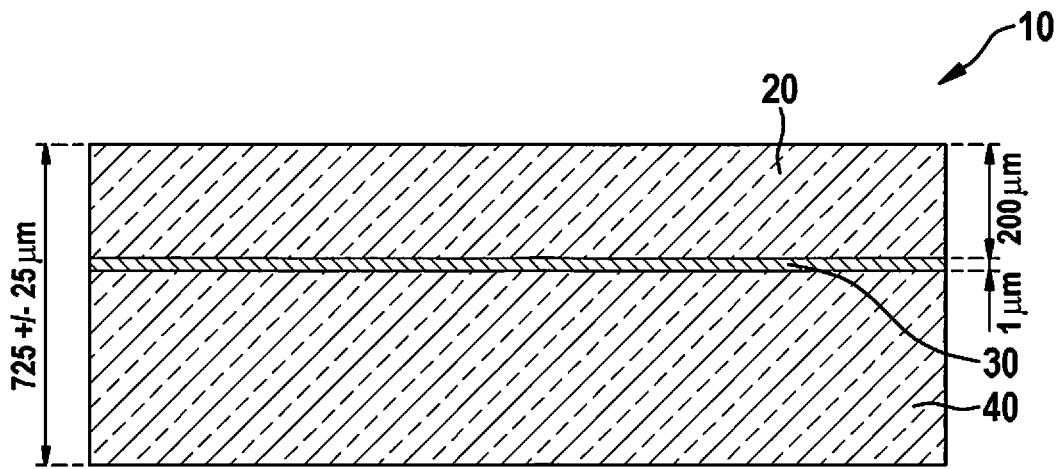

The present application claims the benefit under 35 U.S.C. § 119 of German Patent Application No. DE 102017216904.4 filed on Sep. 25, 2017, which is expressly incorporated herein by reference in its entirety.

BACKGROUND INFORMATION

The present invention relates to a method for producing thin MEMS wafers. Multiple conventional methods for producing thin wafers for MEMS are available in the related art.

A classic technique in semiconductor technology is to grind the back side of a wafer. The disadvantage is that the wafer is afterwards so thin (200-300 µm) that the handling of such thin wafers in standard facilities becomes critical. It is also disadvantageous that, depending on the MEMS element, the wafer may have a high bow. Accordingly, with an extremely bent wafer (bow>600 µm), it is even more difficult to set up a reliable process sequence. This applies in particular to the uniformity of a process on the entire surface, the stability of the wafer on a chuck and the seal between a wafer and the chuck in a process chamber. Furthermore, grinding a MEMS wafer down to 20-200 µm at the end of the process sequence may be too critical because in microphone wafers for example the diaphragms are already exposed and are therefore too fragile for the 3 necessary steps of laminating, grinding, delaminating.

A second conventional technique is the Taiko process. In this instance the wafer is back-thinned by grinding except on the edge so that the wafer remain sufficiently stiff and that the facilities are still able to handle the wafer. Subsequent process steps such as, e.g., lithography are very difficult, however, and probably even in principle impossible to implement because, e.g., in classic resist coating no coating is spun out of the wafer. The edge is a hindrance in this instance.

Another technique comprises bonding a thin wafer onto a carrier wafer. The wafer thus reinforced can be processed further in conventional facilities of the semiconductor industry. The problematic aspect here is how the thin wafer can be separated again at the end of the process. Moreover, with the carrier wafer concept or temporarily bonded wafers, processing of the front side and back side of the wafer is not possible without "rebonding".

SUMMARY

An object of the present invention is to provide a method for producing thin MEMS wafers.

The present invention relates to a method for producing thin MEMS wafers including, for example, the steps:
(A) providing an SOI wafer with an upper silicon layer, a first SiO2 layer and a lower silicon layer, the first SiO2 layer being situated between the upper silicon layer and the lower silicon layer,
(B) producing a second SiO2 layer on the upper silicon layer
(C) producing a MEMS structure on the second SiO2 layer,
(D) introducing clearances into the lower silicon layer extending to the first SiO2 layer,
E) etching the first SiO2 layer and thus removing the lower silicon layer.

Advantageously, the exemplary method of the present invention first produces a MEMS structure on a thick and robust wafer and subsequently thins the wafer so that the MEMS structure is not damaged. Advantageously, the etching of the first SiO2 layer undercuts and thus removes the lower silicon layer, without it being necessary to etch the lower silicon layer itself.

One advantageous development of the example method of the present invention provides for etching away the first SiO2 layer in the clearances following step (D) and subsequently for the clearances to be driven onward to the second SiO2 layer by etching the upper silicon layer. It is advantageous that the second SiO2 layer is also etched in step (E).

One advantageous development of the example method of the present invention provides for trenches to be etched into the upper silicon layer following step (A) and prior to step (B), which extend to the first SiO2 layer and which surround at least one partial area of the upper silicon layer. It is advantageous that the trenches are filled with an SiO2 filling and that in step (B) the second SiO2 layer is produced at least on the partial area of the upper silicon layer. It is advantageous that in step (C) the MEMS structure is produced at least partially above the partial area of the upper silicon layer, at least one access channel to the partial area being created. It is advantageous that after step (C) and prior to step (D) the upper silicon layer is etched into the partial area, the etching medium being introduced through the access channel and thus a cavity being created from the partial area. It is advantageous that subsequently SiO2, which bounds the cavity, is etched, whereby in particular the SiO2 filling as well as areas of the first SiO2 layer and of the second SiO2 layer that border the cavity are removed. It is advantageous that prior to step (D) an etching mask is applied onto the lower silicon layer and that in step (D) clearances are introduced through the etching mask into the lower silicon layer extending to the first SiO2 layer and to the cavity.

The example method according to the present invention advantageously offers the possibility of processing the wafer in a classic manner via subsequent step such as for example lithography and DRIE, which makes it possible to back-thin a wafer, whose back side of the functional structures must be exposed, to a thickness of 20-200 µm. For this purpose, the function layer of an SOI wafer is used as a later target thickness of the MEMS chips.

The present invention allows for back-thinning a wafer very late in the process. This means, among other things, that the wafer no longer requires lithography after back-thinning, or that lithography is performed on the back side prior to back-thinning, and that it is independent of the functional structures in this process. If stressed dielectric layers exist and wafer bow results from it, it is possible to handle the latter because of the "normal" wafer thickness (400-725 µm) until back-thinning occurs at the end of the process.

Optional back-grinding is advantageously performed to known and manageable thicknesses of 400 µm for example. In the example of microphones, the entire process remains almost unchanged except for additional oxide etching during [the formation of] the back side-cavity trench and the separation of the SOI function layer (=MEMS die).

In comparison to bonding, no additional large and expensive facility is required in order to bond and subsequently separate the wafer and the carrier, but merely a facility that allows for the separation of two parts of an SOI wafer.

Following back-thinning to a target thickness of 20-200 µm, only facilities for checking the wafers (defect engineering—DFE) are required. The process of structuring the wafer in a clean room is already completed at this point.

BRIEF DESCRIPTION OF EXAMPLE EMBODIMENTS

FIGS. 1a-f show a first specific example embodiment of the method of the present invention for producing thin MEMS wafers.

FIGS. 2a-I show a second specific example embodiment of the method of the present invention for producing thin MEMS wafers.

Figure 3:
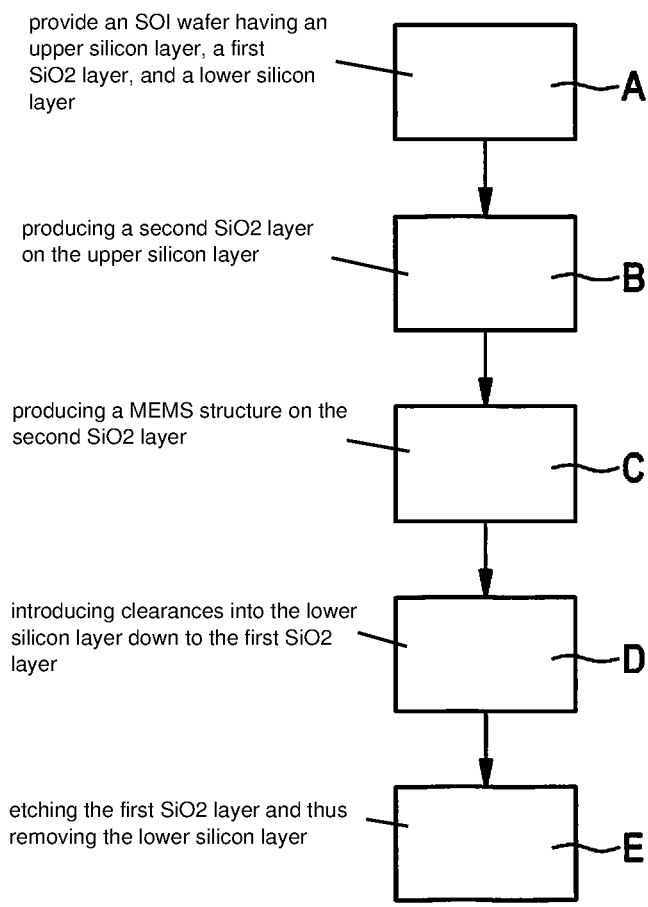

FIG. 3 shows schematically an example method of the present invention for producing thin MEMS wafers.

DETAILED DESCRIPTION OF EXAMPLE EMBODIMENTS

FIGS. 1a-f show a first specific embodiment of an example method of the present invention for producing thin MEMS wafers.

FIG. 1a shows an SOI wafer that is provided for the example method of the present invention. The SOI wafer 10 has a standard thickness of 725 µm+−25 µm, for example. An upper silicon layer 20 has a thickness of approx. 200 µm. Below it is a first SiO2 layer 30 in the form of a buried oxide layer having a thickness of approx. 1 µm. Below it is a lower silicon layer 40 having a thickness of approx. 525 µm.

Figure 1B:
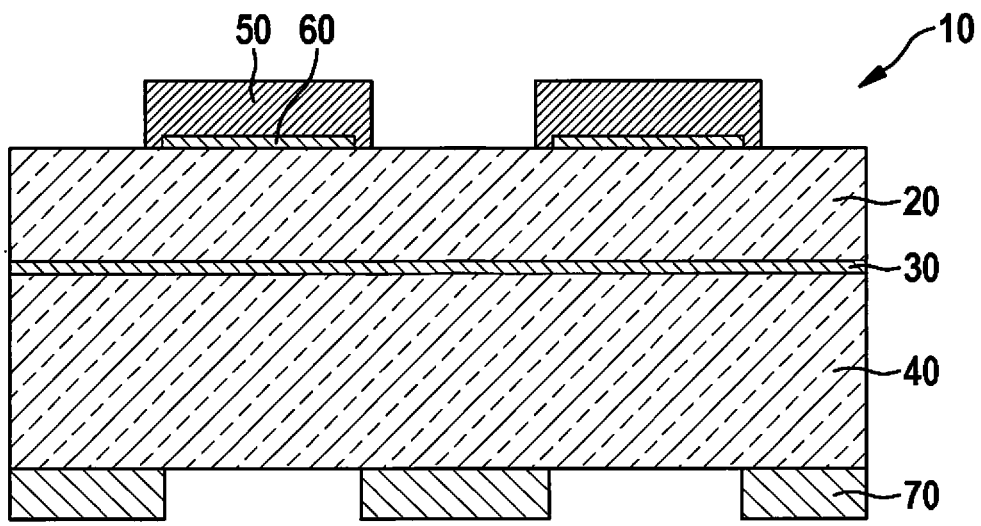

FIG. 1b shows the SOI wafer having MEMS structures on the front side. SOI wafer 10 has a second SiO2 layer 60 on a front side, i.e., on an upper side of upper silicon layer 20. A MEMS structure 50 is produced on it. On a back side of the wafer, i.e. on a bottom side of lower silicon layer 40, an etching mask 70 (lithography mask) is situated for a subsequent etching process. Beforehand, it is possible to back-thin the wafer using standard grinding technology such as CMP, for example. The wafer is back-thinned for example to a thickness of 400-500 µm (not illustrated).

Figure 1C:
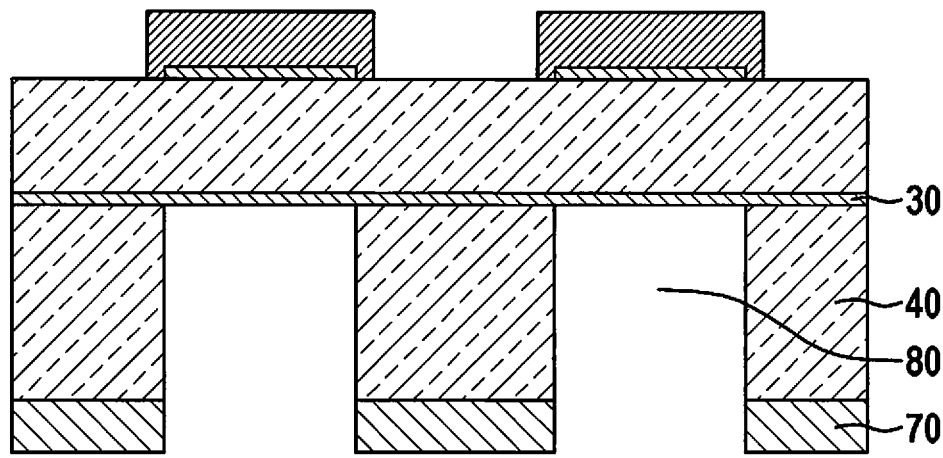

FIG. 1c shows the SOI wafer after half of the trench step. Clearances 80 are etched into lower silicon layer 40 from the back side through mask 70. The buried first SiO2 layer 30 is used as a stop layer in this instance.

Figure 1D:
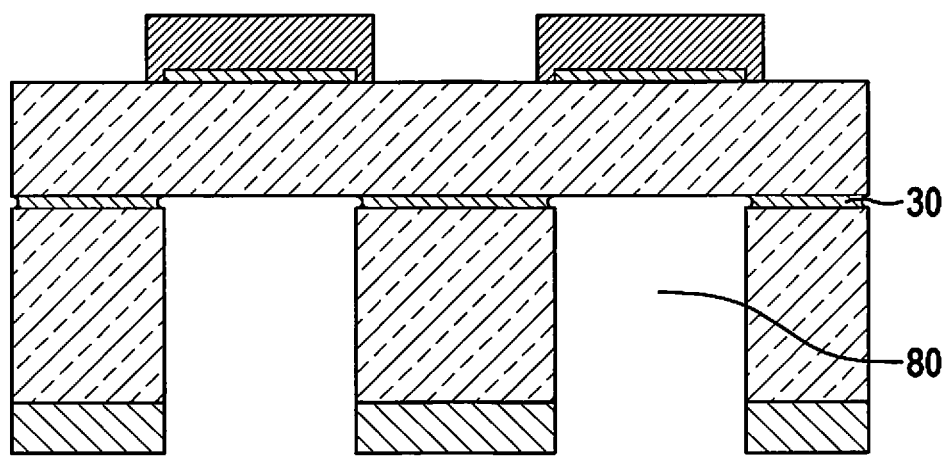

Subsequently, the first SiO2 layer 30 is etched away in clearances 80. FIG. 1d shows SOI wafer 10 after the buried first SiO2 layer 30 has been etched.

Figure 1E:
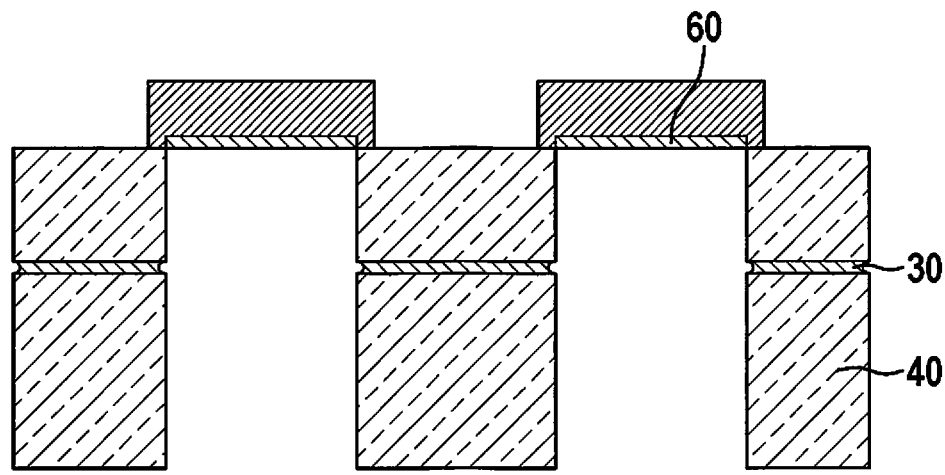

Subsequently, clearances 80 are driven onward to second SiO2 layer 60 in that upper silicon layer 20 is etched. Etching mask 70 is subsequently removed. FIG. 1e shows the SOI wafer after [completion of] the second half of the trench step and the removal of the lithography mask. Second SiO2 layer 60 below MEMS structure 50 is used as a stop layer.

Figure 1F:
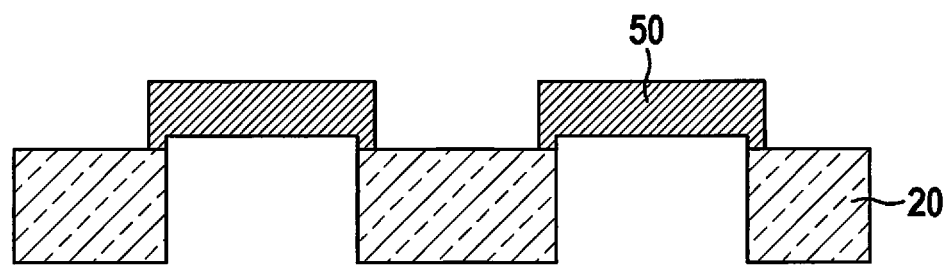

FIG. 1f shows the finished thin MEMS wafer at the end of the method of the present invention in the first specific embodiment. For this purpose, first SiO2 layer 30 and second SiO2 layer 60 are etched from the back side. Etching first SiO2 layer 30 underetches the lower silicon layer 40, detaches it from the MEMS wafer and thus removes it. The silicon portions outside the desired thickness of 20-200 µm are removed in this etching operation. A thin MEMS wafer is thereby produced. It is optionally possible to preserve an edge region of the wafer so that the entire structure remains stiff.

FIGS. 2a-i show a second specific embodiment of the method of the present invention for producing thin MEMS wafers.

Figure 2A:
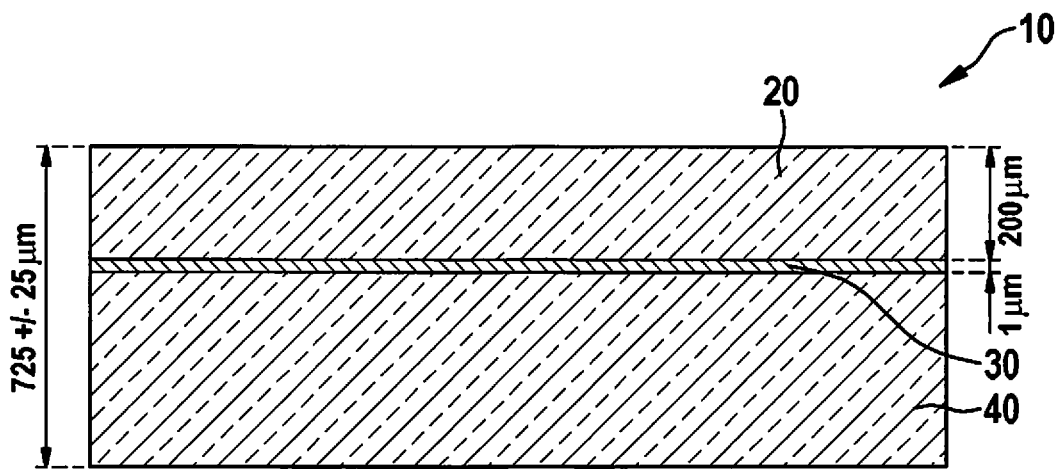

FIG. 2a shows a provided SOI wafer 10 as in FIG. 1a. The SOI wafer 10 has a standard thickness of 725 µm+−25 µm, for example. An upper silicon layer 20 has a thickness of approx. 200 µm. Below it is a first SiO2 layer 30 in the form of a buried oxide layer having a thickness of approx. 1 µm. Below it is a lower silicon layer 40 having a thickness of approx. 525 µm.

Figure 2B:
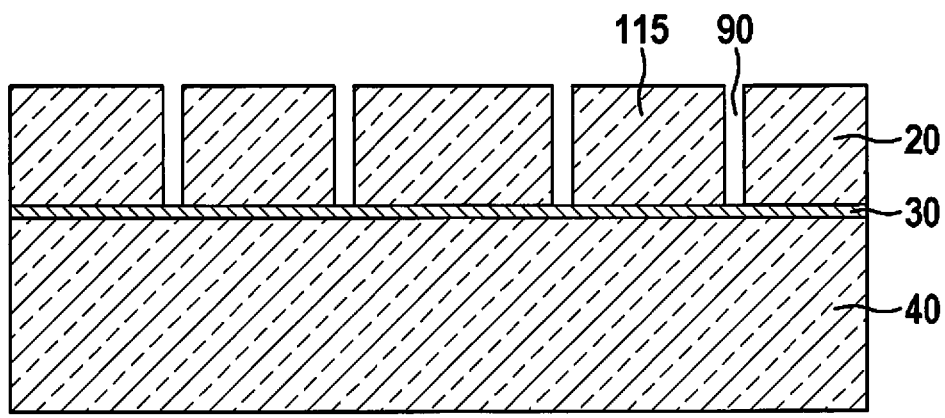

FIG. 2b shows that trenches 90 are etched into upper silicon layer 20, which extend to first SiO2 layer 30 and which surround partial areas 115 of upper silicon layer 20.

Figure 2C:
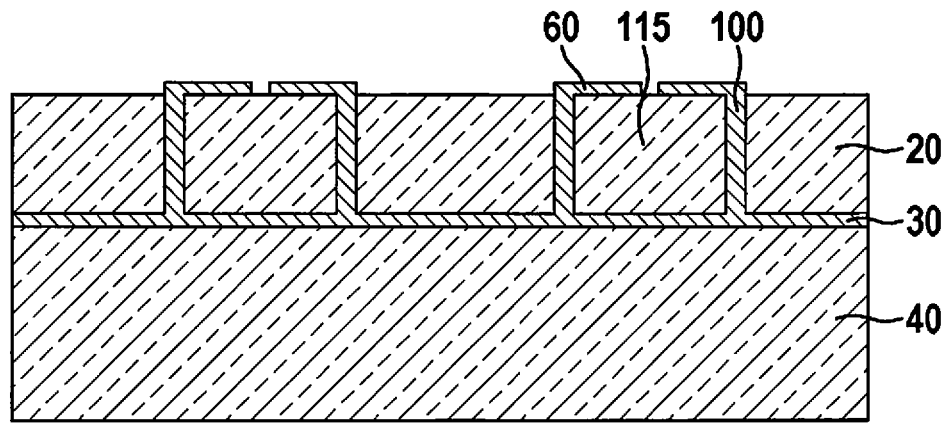

FIG. 2c shows that trenches 90 are filled with an SiO2 filling 100. The purpose of filling the shafts with SiO2 is to smooth the topography on the front side and to provide a future boundary for exposing functional structures by etching. At the same time, in the same process step, a second SiO2 layer 60 is produced at least on the partial areas 115 of upper silicon layer 20. The second SiO2 layer 60 is subsequently structured in such a way that is has at least one access to partial area 115.

Figure 2D:
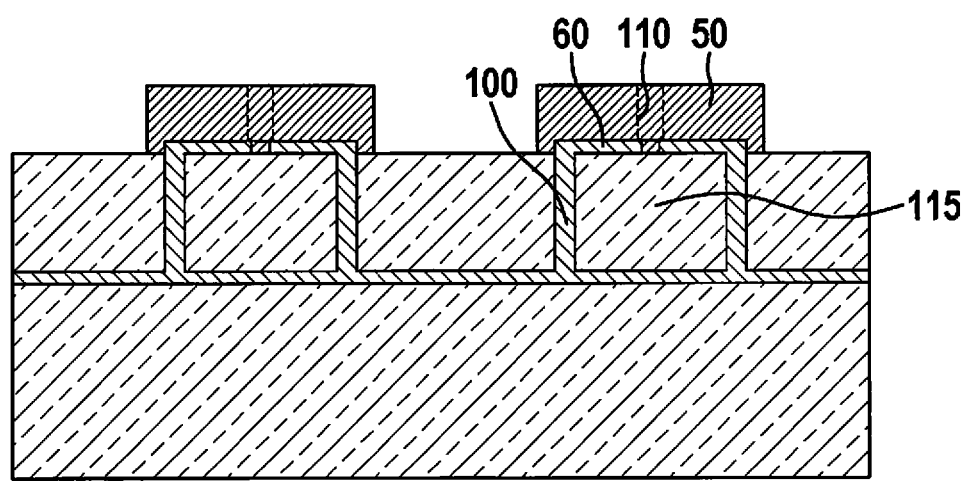

FIG. 2d shows the production of MEMS structures on second SiO2 layer 60. MEMS structures 50 are shown schematically, which are produced at least partially above partial area 115 of upper silicon layer 20, at least one access channel 110 being created to partial area 115. The access channel may additionally also have a separate function for the MEMS structure, for example for microphones.

Figure 2E:
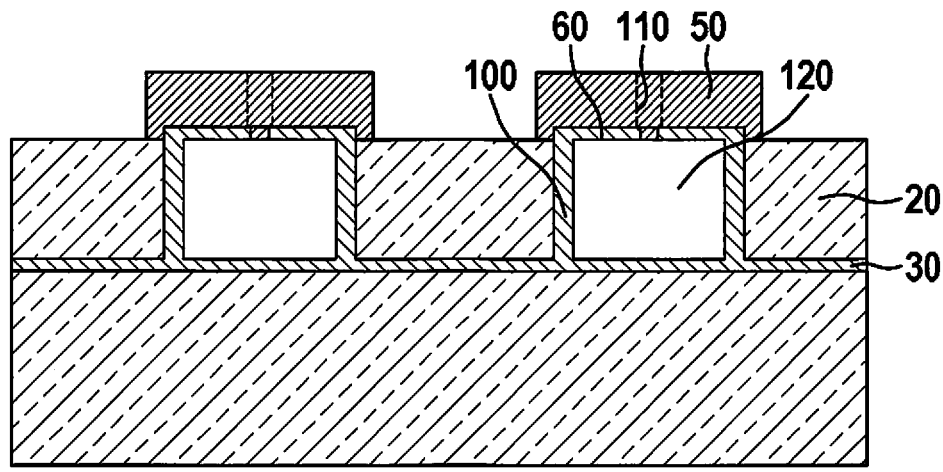

FIG. 2e shows the production of cavities below the MEMS structures. The upper silicon layer 20 is etched in partial areas 115, the etching medium being respectively introduced through access channel 110. A cavity 120 is thus produced from the partial area 115. XeF2 may be used for etching, for example, or another isotropic dry etching process.

Figure 2F:
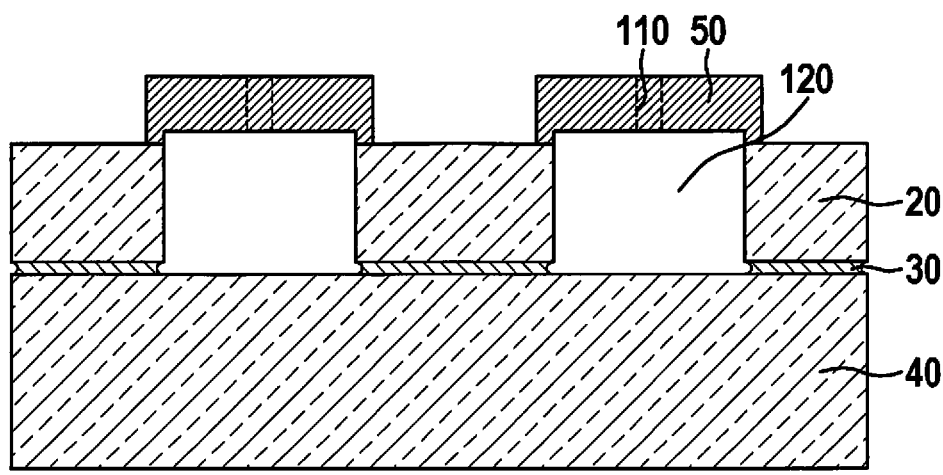

FIG. 2f shows the removal of SiO2 from the walls of the cavity. Following the production of the cavity itself, the SiO2 that bounds cavity 120 is etched, whereby in particular the SiO2 filling 100 as well as areas of the first SiO2 layer 30 and of the second SiO2 layer 60 that border the cavity are removed. Thus, SiO2 is etched everywhere around the created cavities through the channels of the functional structures.

Figure 2G:
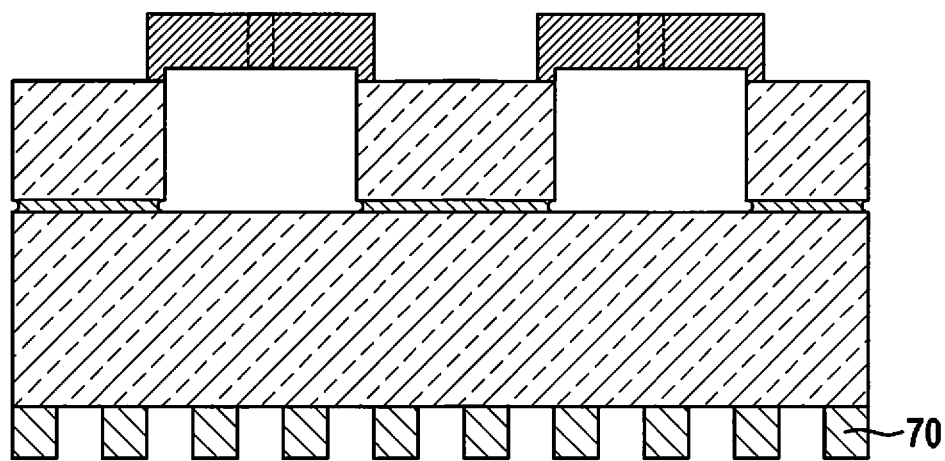

FIG. 2g shows the lithography of access shafts to the buried first SiO2 layer on the back side. For this purpose, an etching mask 70, the lithography mask, is applied on lower silicon layer 40. The mask is independent of the functional structures, in particular the MEMS structure 50. Hence it may be optimized relatively freely in a desired shape.

Figure 2H:
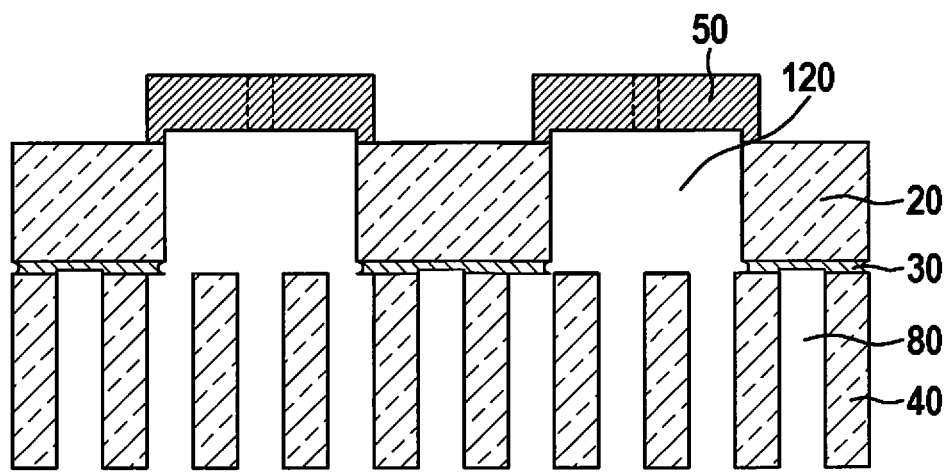

FIG. 2h shows the wafer after trench etching and stripping of the mask. Through etching mask 70, clearances 80 are etched into lower silicon layer 40, which extend to first SiO2 layer 30 and to cavity 120. First SiO2 layer 30 is used as an etching stop layer in this instance. Etching mask 70 is subsequently removed.

Figure 2I:
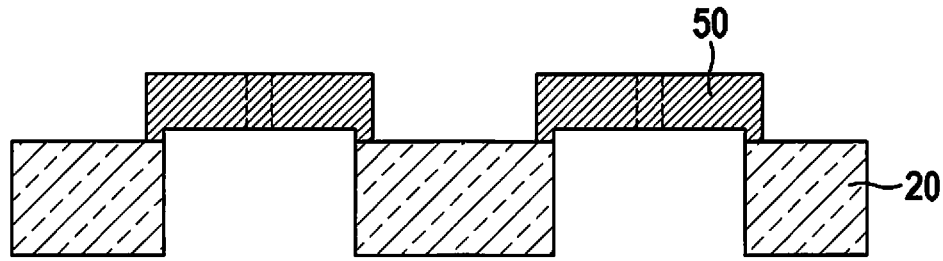

FIG. 2i shows the finished thin MEMS wafer at the end of the method of the present invention in the second specific embodiment. First SiO2 layer 30 is etched from the back side. Etching first SiO2 layer 30 underetches the lower silicon layer 40, detaches it from the MEMS wafer and thus removes it. The result is a thin MEMS wafer, whose thickness is essentially determined by the height of the MEMS structure 50 and by the thickness of upper silicon layer 20. The silicon portions outside the desired thickness of 20-200 µm are removed in this etching operation. It is optionally possible to preserve an edge region of the wafer so that the entire structure remains stiff.

FIG. 3 shows schematically the example method of the present invention for producing thin MEMS wafers. The method includes the following steps:
(A) providing an SOI wafer having an upper silicon layer, a first SiO2 layer and a lower silicon layer, the first SiO2 layer being situated between the upper silicon layer and the lower silicon layer,
(B) producing a second SiO2 layer on the upper silicon layer
(C) producing a MEMS structure on the second SiO2 layer, and
(D) introducing clearances into the lower silicon layer down to the first SiO2 layer,
(E) etching the first SiO2 layer and thus removing the lower silicon layer.

LIST OF REFERENCE SYMBOLS

10 SOI wafer
20 upper silicon layer
30 first SiO2 layer
40 lower silicon layer
50 MEMS structures
60 second SiO2 layer
70 etching mask
80 clearance
90 trench
100 SiO2 filling
110 access channel
115 partial areas of the upper silicon layer
120 cavity

What is claimed is:

1. A method for producing thin MEMS wafers, comprising:
   (A) providing an SOI wafer having an upper silicon layer, a first SiO2 layer and a lower silicon layer, the first SiO2 layer being situated between the upper silicon layer and the lower silicon layer;
   (B) producing a second SiO2 layer on the upper silicon layer;
   (C) producing a MEMS structure on the second SiO2 layer;
   (D) introducing clearances into the lower silicon layer that extend to the first SiO2 layer; and
   (E) etching the first SiO2 layer and thus removing the lower silicon layer,
   wherein, following step (A) and prior to step (B), trenches are etched into the upper silicon layer, which extend to the first SiO2 layer and which surround at least one partial area of the upper silicon layer,
   wherein the trenches are filled with an SiO2 filling and in step (B) the second SiO2 layer is produced at least on the partial area of the upper silicon layer.

2. The method for producing thin MEMS wafers as recited in claim 1, wherein, following step (D), the first SiO2 layer is etched away in the clearances and subsequently the clearances are driven onward to the second SiO2 layer by etching the upper silicon layer.

3. The method for producing thin MEMS wafers as recited in claim 2, wherein the second SiO2 layer is also etched in step (E).

4. The method for producing thin MEMS wafers as recited in claim 1, wherein in step (C) the MEMS structure is produced at least partially above the partial area of the upper silicon layer, at least one access channel to the partial area being created.

5. The method for producing thin MEMS wafers as recited in claim 4, wherein after step (C) and prior to step (D) the upper silicon layer is etched in the partial area, etching medium being introduced through the access channel and thus a cavity being created from the partial area.

6. The method for producing thin MEMS wafers as recited in claim 5, wherein subsequently SiO2, which bounds the cavity, is etched, whereby SiO2 filling as well as areas of the first SiO2 layer and of the second SiO2 layer that border the cavity are removed.

7. The method for producing thin MEMS wafers as recited in claim 6, wherein in step (D) the clearances are introduced extending to the first SiO2 layer and to the cavity.

* * * * *